United States Patent
Chou et al.

(10) Patent No.: US 7,843,721 B1
(45) Date of Patent: Nov. 30, 2010

(54) MEMORY CELL INCLUDING AN EMITTER FOLLOWER AND EMITTER FOLLOWER SENSING SCHEME AND METHOD OF READING DATA THEREFROM

(75) Inventors: Richard K. Chou, Palo Alto, CA (US); Damodar R. Thummalapally, Milpitas, CA (US)

(73) Assignee: SuVolta, Inc., Los Gatos, CA (US)

( * ) Notice: Subject to any disclaimer, the term of this patent is extended or adjusted under 35 U.S.C. 154(b) by 218 days.

(21) Appl. No.: 12/284,037

(22) Filed: Sep. 18, 2008

(51) Int. Cl.
*G11C 11/34* (2006.01)
(52) U.S. Cl. .................................. 365/177; 365/189.05
(58) Field of Classification Search ................. 365/177, 365/189.05
See application file for complete search history.

(56) References Cited

U.S. PATENT DOCUMENTS 5,567,961 A * 10/1996 Usagawa et al. ............. 257/197
2009/0057728 A1 * 3/2009 Boyle ......................... 257/273
2009/0168508 A1 * 7/2009 Kapoor et al. ............... 365/177

OTHER PUBLICATIONS

Wingard et al., Circuit Techniques for Large CSEA SRAM's, IEEE Journal of Solid-State Circuits, Jun. 1992, pp. 908-919, vol. 27, No. 6.

* cited by examiner

*Primary Examiner*—Tuan T. Nguyen
(74) *Attorney, Agent, or Firm*—Darryl G. Walker

(57) ABSTRACT

A memory device including a static random access memory (SRAM) cell comprising junction field effect transistors (JFETs) has been disclosed. The memory cell includes a first bipolar junction transistor (BJT) for driving a bit line at logic levels having a potential outside the potential range in which the SRAM cell operates. An amplifier including a level translator circuit provides a level shifting operation on the data provided by the bit line to provide level shifted data having a voltage swing within the potential range in which the SRAM cell operates. The level translator circuit includes a second BJT. In this way, fast read operation of a SRAM cell comprising JFETs may be provided.

2 Claims, 7 Drawing Sheets

US 7,843,721 B1

MEMORY CELL INCLUDING AN EMITTER FOLLOWER AND EMITTER FOLLOWER SENSING SCHEME AND METHOD OF READING DATA THEREFROM

TECHNICAL FIELD

The present invention relates generally to memory circuits, and more particularly to junction field effect transistor (JFET) static random access memory (SRAM) cells having a bipolar junction transistor (BJT) sensing circuit.

BACKGROUND OF THE INVENTION

Static random access memories (SRAMs) are storage devices that are used as high-speed memory such as cache or the like. SRAM cells for metal-oxide-semiconductor (MOS) type technologies, particularly CMOS type technology are well known.

Co-pending U.S. patent application Ser. No. 11/452,442 filed on Jun. 13, 2006 and U.S. Provisional Patent Application Ser. No. 60/799,787 filed on May 11, 2006, both by Ashok K. Kapoor, show examples of novel circuits that include junction field effect transistors (JFETs) that operate at relatively low voltage levels (e.g., 0 to +0.5 volts). Such circuits can form integrated circuits that include few, or preferably no MOS type transistors. JFET transistors may have manufacturing advantages over MOSFETs due to the lack of a thin gate oxide layer.

SUMMARY OF THE INVENTION

A memory device is disclosed including a static random access memory (SRAM) cell comprising junction field effect transistors (JFETs). The memory cell includes a first bipolar junction transistor (BJT) for driving a bit line at logic levels having a potential outside the potential range in which the SRAM cell operates. An amplifier including a level translator circuit provides a level shifting operation on the data provided by the bit line to provide level shifted data having a voltage swing within the potential range in which the SRAM cell operates. The level translator circuit includes a second BJT. In this way, fast read operation of a SRAM cell including JFETs may be provided.

According to the embodiments, a first memory cell may include a first JFET and a first BJT. The first JFET may have a channel region coupled between a storage node and a base terminal of the first BJT.

According to the embodiments, the first BJT may have an emitter terminal coupled to a bit line.

According to the embodiments, the bit line may be coupled to provide a data value from the first memory cell to a base of a second BJT.

According to the embodiments, the first and second BJTs may be complementary (i.e. one may be a pnp BJT and the other may be an npn BJT).

According to the embodiments, the first memory cell may include a second JFET having a source terminal coupled to a first potential and a drain terminal coupled to the data storage node. The second BJT may have a collector terminal coupled to a second potential. The second potential may be greater than the first potential.

According to the embodiments, the first JFET may have a gate terminal connected to a word line.

According to the embodiments, a second memory cell may include a third JFET having a channel region coupled between a storage node and a base terminal of the first BJT.

According to the embodiments, a drain of the first JFET, a drain of the second JFET and the base terminal of the first BJT may include the same continuous diffusion layer in the device.

According to the embodiments, a device may include a plurality of memory cells arranged in a matrix of rows and columns formed by a plurality of intersecting bit lines and word lines. Each memory cell may include a JFET pass gate having a source/drain path coupled between a data storage node and a base terminal of a first BJT. The first BJT includes an emitter terminal coupled to a predetermined one of the plurality of bit lines.

According to the embodiments, each memory cell may include a latch circuit providing the data storage node. The latch circuit includes cross-coupled inverters, each inverter including complementary JFETs.

According to the embodiments, each of the plurality of bit lines is coupled to a corresponding one of a plurality of column select JFETs. Each of the column select JFETs having a source/drain path coupled between the corresponding one of the plurality of bit lines and a global bit line.

According to the embodiments, a second BJT includes a base terminal coupled to the global bit line.

According to the embodiments, each memory cell receives a first power supply potential. Each of the plurality of bit lines includes a precharge JFET having a source drain path coupled between the corresponding bit line and a second power supply potential.

According to the embodiments, each memory cell includes a base terminal precharge JFET having a source/drain path coupled between the base terminal of the first BJT and a power supply potential and a gate terminal coupled to the read word line.

According to the embodiments, a first SRAM cell may include JFETs having a data storage node coupled to a base terminal of a first BJT. The SRAM cell may be coupled between a first power supply potential and a second power supply potential.

According to the embodiments, the first BJT may include a collector terminal coupled to the first power supply potential and an emitter terminal coupled to a bit line.

According to the embodiments, a precharge circuit may be coupled to the bit line. The precharge circuit may include a bit line precharge JFET having a source/drain path coupled between the bit line and a third power supply potential.

According to the embodiments, a column select circuit may include a column select JFET having a source/drain path coupled between the bit line and a global bit line and a gate coupled to receive a column select signal.

According to the embodiments, a sense amplifier may include a level translator circuit coupled to receive the global bit line and provide a level shifted output signal.

According to the embodiments, the sense amplifier circuit may include a differential amplifier circuit coupled to receive the level shifted output signal at a first input terminal and provide a data output signal.

According to the embodiments, a reference generator may be coupled to provide a reference voltage to a second terminal of the differential amplifier circuit.

According to the embodiments, a method of reading data from a memory cell including a plurality of JFETs may include the steps of: receiving data latched by the plurality of JFETs at a base terminal of a first bipolar junction transistor (BJT), the data having a first logic level at a first potential and a second logic level at a second potential; and providing a data signal at an emitter terminal of the BJT having the first logic level at a third potential and the second logic level at a fourth potential, the third and fourth potentials being outside the first and second potentials.

According to the embodiments, a method may include level translating the data signal so that the first logic level and the second logic levels are within the first potential and the second potential.

According to the embodiments, a complementary emitter follower sensing scheme may prevent saturation of the bipolar transistors as opposed to a typical BiCMOS/ECL sensing scheme that uses differential pairs which can saturate.

DETAILED DESCRIPTION OF THE EMBODIMENTS

Various embodiments of the present invention will now be described in detail with reference to a number of drawings. The embodiments show circuits and methods constructed with junction field effect transistors (JFETs), for example four terminal JFETs of complementary conductivity types (n-channel and p-channel types or PJFETs and NJFETs). Four terminal JFETs can include two control terminals on different sides of a channel region. In a four terminal JFET, the back gate terminal may be conceptualized as a body terminal and the device may be essentially operated as a three terminal JFET. In yet another mode of operation, the back gate terminal may be tied to the front gate terminal which may improve operating characteristics.

JFETs are formed with pn junctions and as such, bipolar junction transistors (BJTs) may be formed in conjunction with JFETs on the same semiconductor device with minimal additional process steps. BJTs may include pnp BJTs and npn BJTs.

Figure 1:
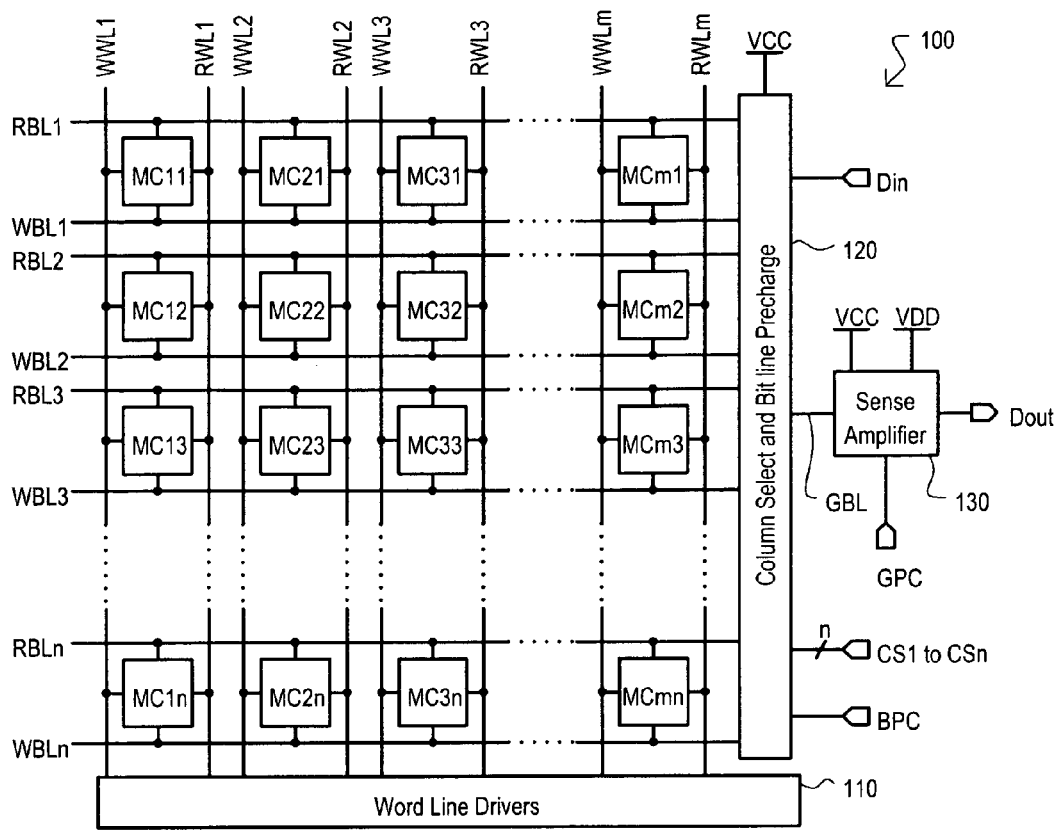
FIG. 1 is a block schematic diagram of a memory device according to an embodiment.

Referring now to FIG. 1, a block schematic diagram of a memory device according to an embodiment is set forth in a block schematic diagram and given the general reference character 100. Memory device 100 may be a static random access memory (SRAM) device.

Memory device 100 may include an array of memory cells (MC11 to MCmn), word line drivers 110, a column select and bit line precharge circuit 120, and a sense amplifier 130. Memory device 100 may include other circuits, such as control circuitry, address decoding circuitry, and write circuitry, as just a few examples, which are not shown to avoid unduly cluttering the drawing.

The array of memory cells (MC11 to MCmn) are formed in rows and columns. In the particular embodiment, there are m rows and n columns, where m and n are integers greater than 1. A row of memory cells (MC11 to MCmn) may be commonly connected to a predetermined read word line (RWL1 to RWLm) and a corresponding write word line (WWL1 to WWLn). A column of memory cells (MC11 to MCmn) may be commonly connected to a predetermined read bit line (RBL1 to RBLm) and a corresponding write bit line (WBL1 to WBLn). For example, one row of memory cells (MC11, MC12, MC13, to Mc1n) may be commonly connected to read word line RWL1 and write word line WWL1 and another row of memory cells (MC31, MC32, MC33, to MC3n) may be commonly connected to read word line RWL3 and write word line WWL3. Likewise, one column of memory cells (MC11, MC21, MC31, to MCm1) may be commonly connected to read bit line RBL1 and write bit line WBL1 and another column of memory cells (MC13, MC23, MC33, to MCm3) may be commonly connected to read bit line RBL3 and write bit line WBL3.

Word line drivers 110 may be connected to selectively drive a predetermined read word line (RWL1 to RWLm) and/or write word line (WWL1 to WWLm).

Column select and bit line precharge circuit 120 may be connected to the read bit lines (RBL1 to RBLm) and write bit lines (WBL1 to WBLm). Column select and bit line precharge circuit 120 may be connected to select a predetermined read bit line (RBL1 to RBLm) and/or write word line (WBL1 to WBLm) in accordance with received column select signals (CS1 to CSn). Column select and bit line precharge circuit 120 may also include circuitry to precharge the read bit lines (RBL1 to RBLn) in accordance with a bit line precharge signal BPC. Column select and bit line precharge circuit 120 may also receive data input Din, for writing data to the array of memory cells (MC11 to MCmn) in a write operation and may provide data to a global bit line GBL from the array of memory cells (MC11 to MCmn) in a read operation. Column select and bit line precharge circuit 120 may receive a power supply voltage VCC.

Sense amplifier 130 may receive data on a global bit line GBL during a read operation and may provide output data Dout. Sense amplifier 130 may receive a global bit line precharge signal GPC, a power supply voltage VCC, and a power supply voltage VDD.

Memory cells (MC11 to MCmn) may be static random access memory (SRAM) cells, as but one example.

Figure 2:
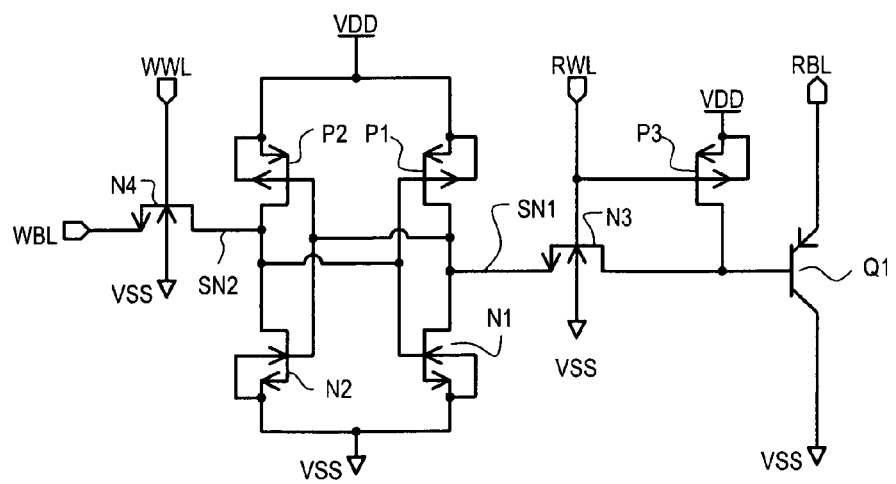
FIG. 2 is a circuit schematic diagram of a memory cell according to an embodiment.

Referring now to FIG. 2, a circuit schematic diagram of a memory cell according to an embodiment is set forth and given the general reference character 200. Memory cell 200 may be used for memory cells (MC11 to MCmn) in the memory device 100 of FIG. 1.

Memory cell 200 can have an input connected to a write bit line WBL, an input connected to a write word line WWL, an input connected to a read word line RWL, and an output connected to a read bit line RBL.

Memory cell 200 may include NJFETs (N1 to N4), PJFETs (P1 to P3), and a BJT Q1. BJT Q1 may be a pnp BJT. NJFET N1 may have a source terminal connected to a ground potential VSS, a drain connected to a first storage node SN1, a gate terminal connected to a second storage node SN2, and a body terminal connected to the ground potential VSS. The body terminal may also be conceptualized as a back gate terminal. NJFET N2 may have a source terminal connected to a ground potential VSS, a drain connected to the second storage node SN2, a gate terminal connected to the first storage node SN1, and a body terminal connected to the ground potential. PJFET P1 may have a source terminal connected to a power supply potential VDD, a drain terminal connected to the first storage node SN1, a gate terminal connected to the second storage node SN2, and a body terminal connected to the power supply potential VDD. PJFET P2 may have a source terminal connected to a power supply potential VDD, a drain terminal connected to the second storage node SN2, a gate terminal connected to the first storage node SN1, and a body terminal connected to the power supply potential VDD. NJFET N3 may include a source terminal connected to the first data storage node SN1, a drain terminal commonly connected to a base terminal of BJT Q1 and a drain of PJFET P3, a gate terminal connected to read word line RWL, and a body terminal connected to ground potential VSS. NJFET N4 may include a source terminal connected to the second data storage node SN2, a drain terminal connected to a write bit line WBL, a gate terminal connected to write word line WWL, and a body terminal connected to ground potential VSS. PJFET P3 may have a source terminal connected to power supply potential VDD, a gate terminal connected to the read word line RWL, and a body terminal connected to power supply potential VDD. BJT Q1 may include an emitter terminal connected to the read bit line RBL and a collector terminal connected to the ground potential VSS.

PJFET P3 may be conceptualized as a base terminal precharge JFET because JFET P3 may precharge the base terminal of BJT Q1 during a precharge operation.

PJFETs (P1 and P2) and NJFETs (N1 and N2) collectively form a latch for storing data or the like. NJFET N1 and PJFET P1 form one inverter and NJFET N2 and PJFET P2 form a second inverter. The first and second inverters are cross-coupled in that the input of the first inverter (second storage node SN2) receives the output of the second inverter (first storage node SN1) and vice-versa, thereby forming a latch.

NJFET N3 may be conceptually viewed as a pass gate for passing data from first storage node SN1 to the base of BJT Q1. In this case, NJFET N3 may be a read pass gate. Likewise NJFET N4 may be conceptually viewed as a pass gate for passing data from write bit line WBL to second storage node SN2. In this case, NJFET N3 may be a read pass gate.

Figure 3:
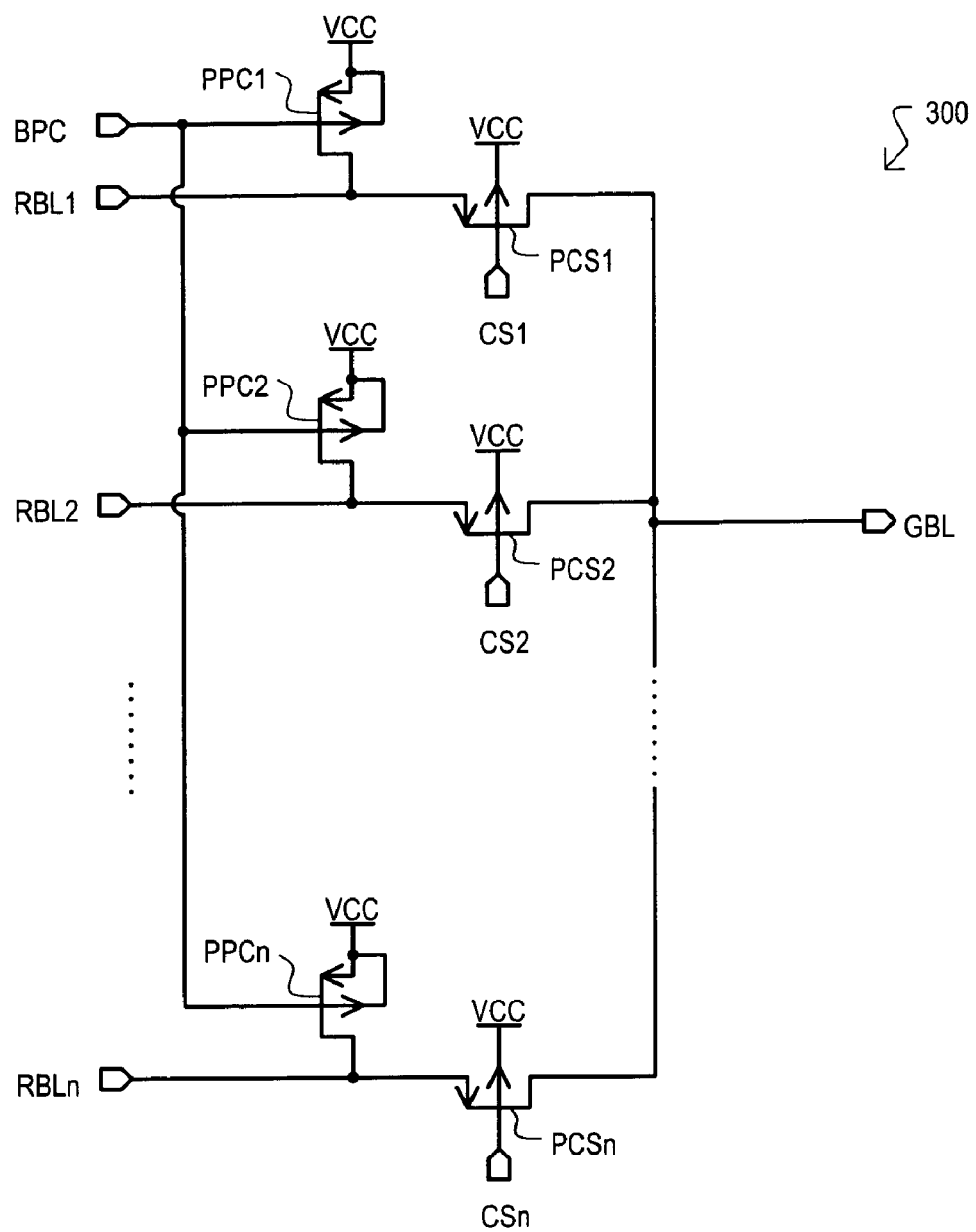
FIG. 3 is a circuit schematic diagram of a column select and bit line precharge circuit according to an embodiment.

Referring now to FIG. 3, a circuit schematic diagram of a column select and bit line precharge circuit according to an embodiment is set forth and given the general reference character 300. Column select and bit line precharge circuit 300 may be used as column select and bit line precharge circuit 120 in the memory device 100 of FIG. 1. It should be noted that the column select and bit line precharge circuit 120 may include write-path circuits which have not been shown to avoid unduly cluttering up the figure.

Column select and bit line precharge circuit 300 may receive read bit lines (RBL1 to RBLn), column select signals (CS1 to CSn), a bit line precharge signal BPC, and may provide data at a global bit line GBL. Column select and bit line precharge circuit 300 may include PJFETs (PCS1 to PCSn) and PJFETs (PPC1 to PPCn).

PJFET PCS1 can have a source terminal connected to read bit line RBL1, a drain terminal connected to global bit line GBL, a gate terminal connected to receive a column select signal CS1, and a body terminal connected to power supply potential VCC. PJFET PCS2 can have a source terminal connected to read bit line RBL2, a drain terminal connected to global bit line GBL, a gate terminal connected to receive a column select signal CS2, and a body terminal connected to power supply potential VCC. Each read bit line (RBL1 to RBLn) may include a likewise connected PJFET until PJFET PCSn can have a source terminal connected to read bit line RBLn, a drain terminal connected to global bit line GBL, a gate terminal connected to receive a column select signal CSn, and a body terminal connected to power supply potential VCC.

In this way, PJFETs (PCS1 to PCSn) may be configured to provide a column selection function so that a predetermined read bit line (RBL1 to RBLn) may be electrically connected to the global bit line GBL in accordance with the activation of a corresponding column select signal (CS1 to CSn). PJFETs (PCS1 to PCSn) may be conceptualized as column select JFETs.

PJFET PPC1 can have a source connected to power supply potential VCC, a drain connected to read bit line RBL1, a gate connected to receive a bit line precharge signal BPC, and a body terminal connected to power supply potential VCC. PJFET PPC2 can have a source connected to power supply potential VCC, a drain connected to read bit line RBL2, a gate connected to receive a bit line precharge signal BPC, and a body terminal connected to power supply potential VCC. Each read bit line (RBL1 to RBLn) may include a likewise connected PJFET until PJFET PPCn can have a source connected to power supply potential VCC, a drain connected to read bit line RBLn, a gate connected to receive a bit line precharge signal BPC, and a body terminal connected to power supply potential VCC.

In this way, during a precharge operation, bit line precharge signal BPC may go to a logic low level, thus turning on PJFETs (PPC1 to PPCn) to precharge every read bit line (RBL1 to RBLn) to a power supply potential VCC or a high level. PJFETs (PPC1 to PPCn) may be conceptualized as bit line precharge JFETs.

Figure 4:
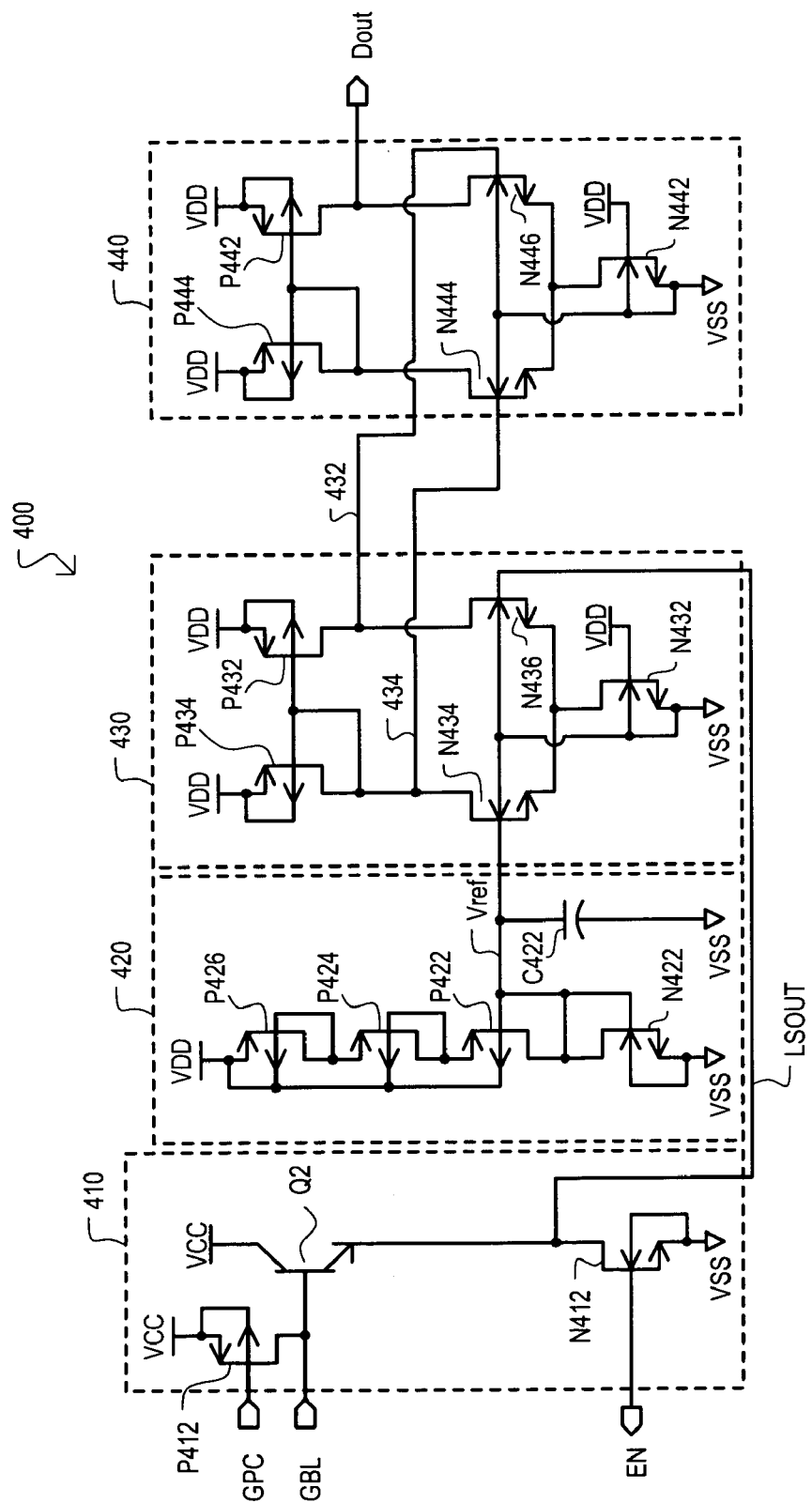
FIG. 4 is a circuit schematic diagram of a sense amplifier circuit according to an embodiment.

Referring now to FIG. 4, a circuit schematic diagram of a sense amplifier circuit according to an embodiment is set forth and given the general reference character 400. Sense amplifier circuit 400 may be used as sense amplifier circuit 130 in the memory device 100 of FIG. 1.

Sense amplifier circuit 400 may have inputs coupled to receive a global precharge signal GPC, a global bit line GBL, and an enable signal EN and may provide a data output signal Dout. Sense amplifier circuit 400 may include a level translator circuit 410, a reference generator circuit 420, a first differential amplifier circuit 430, and a second differential amplifier circuit 440.

The level translator circuit 410 may receive the global precharge signal GPC, enable signal EN, and data on a global bit line GBL as inputs and may provide a level shifted output signal LSOUT as an output. Level translator circuit 410 may include a PJFET P412, NJFET N412, and a BJT Q2. BJT Q2 may be a npn BJT.

PJFET P412 may have a source terminal connected to the power supply potential VCC, a drain terminal connected to the global bit line GBL, a gate terminal connected to receive global precharge signal GPC, and a body terminal connected to power supply potential VCC. BJT Q2 may have a collector terminal connected to power supply potential VCC, an emitter terminal connected to a drain terminal of NJFET N412 to provide the level shifted output signal LSOUT, and a base terminal connected to receive the data from the global bit line GBL. NJFET N412 may have a source terminal connected to ground potential VSS, a gate terminal connected to receive enable signal EN, and a body terminal connected to ground potential VSS.

Reference generator circuit 420 generates a reference voltage Vref used by the first differential amplifier circuit 430. Reference generator 420 include PJFETs (P422 to P426), NJFET N422, and a capacitor C422. PJFET P426 may have a source terminal connected to power supply potential VDD and a drain terminal commonly connected to a gate terminal. PJFET P424 may have a source terminal connected to the drain terminal of PJFET 426 and a drain terminal commonly connected to a gate terminal. PJFET P422 may have a source terminal connected to a drain terminal of PJFET 424 and a drain and a gate terminal commonly connected to provide reference voltage Vref. PJFETs (P422 to P426) may each have a body terminal commonly connected to power supply potential VDD. NJFET 422 may have a drain and a gate terminal commonly connected to the reference potential Vref and a source terminal and a body terminal commonly connected to the ground potential VSS. Capacitor C422 may have a first terminal connected to the reference potential Vref and a second terminal connected to the ground potential VSS.

First differential amplifier circuit 430 may receive the reference potential Vref and level shifted output signal LSOUT as inputs and may provide differential output signals at terminals (432 and 434). First differential amplifier circuit 430 may include PJFETs (P432 and P434) and NJFETs (N432, N434, and N436).

NJFET N432 may have a source terminal connected to the ground potential VSS, a drain terminal commonly connected to the source terminals of NJFETs (N434 and N436), and a gate terminal connected to the power supply potential VDD. NJFET N434 may have a gate terminal connected to receive reference voltage Vref and a drain terminal connected to provide a differential output signal at terminal 432. NJFET 436 may have a gate terminal connected to receive level shifted output signal LSOUT from the level shifter circuit 410 and a drain terminal connected to provide a differential output signal at terminal 434. NJFETs (N432, N434, and N436) may have body terminals connected to the reference potential VSS.

PJFET P432 may have a source terminal connected to power supply potential VDD, a drain terminal connected to terminal 432, and a gate terminal commonly connected to a drain terminal and a gate terminal of PJFET P434. PJFET P434 may have a source terminal connected to power supply potential VDD. PJFETs (P432 and P434) may have body terminals connected to power supply potential VDD.

Second differential amplifier circuit 440 may receive the differential output signals at terminals (432 and 434) provided by first differential amplifier circuit and may provide a data output signal Dout. Second differential amplifier circuit 440 may include PJFETs (P442 and P444) and NJFETs (N442, N444, and N446).

NJFET N442 may have a source terminal connected to the ground potential VSS, a drain terminal commonly connected to the source terminals of NJFETs (N444 and N446), and a gate terminal connected to the power supply potential VDD. NJFET N444 may have a gate terminal connected to terminal 434 and a drain terminal commonly connected to a drain terminal and a gate terminal of PJFET P444 and a gate terminal of PJFET P442. NJFET N446 may have a gate terminal connected to terminal 432 and a drain terminal connected to provide data output signal Dout. NJFETs (N442, N444, and N446) may have body terminals connected to the reference potential VSS.

PJFET P442 may have a source terminal connected to power supply potential VDD, a drain terminal connected to provide data output signal Dout, and a gate terminal commonly connected to a drain terminal and a gate terminal of PJFET P444. PJFET P444 may have a source terminal connected to power supply potential VDD. PJFETs (P442 and P444) may have body terminals connected to power supply potential VDD.

In the particular embodiment, power supply potential VDD may be about 0.5 volts. Also, in the particular embodiment power supply potential VCC may be about 1.0 volts.

Figure 5:
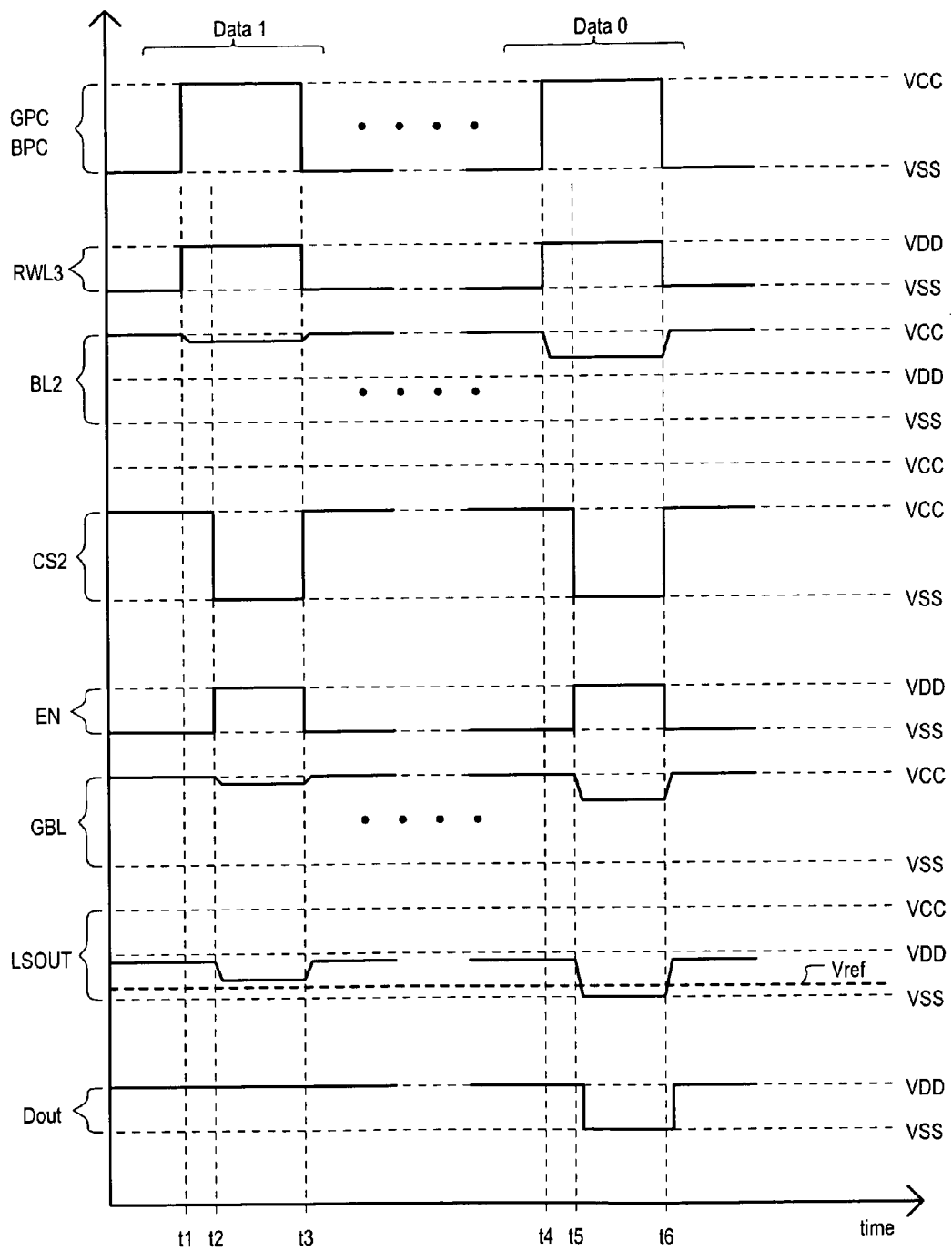
FIG. 5 is a timing diagram illustrating the operation of the memory device of FIG. 1.

FIG. 5 is a timing diagram illustrating the operation of the memory device of FIG. 1.

An explanation of the operation of the embodiments of FIGS. 1 to 4 will now be set forth with reference to FIG. 5 in conjunction with FIGS. 1 to 4.

FIG. 5 illustrates various signals during a read operation for memory device 100 in a case a data "1" is stored in a memory cell and in a case when a data "0" is stored in a memory cell.

Before time t1, memory device 100 may be considered to be in a precharge state.

In a precharge state, when the memory device 100 is not accessing any of the memory cells (MC11 to MCmn), read word lines (RWL1 to RWLm), write word lines (WWL1 to WWLm), bit line precharge signal BPC, global bit line precharge signal GPC, and enable signal EN are all in a logic low level.

In a memory cell 200, with read word line RWL at a logic low level, NJFET N3 is turned off and PJFET P3 is turned on. With NJFET N3 turned off, the base terminal of BJT Q1 is isolated from the first storage node SN1. With PJFET P3 turned on, the base of BJT Q1 may be driven to the power supply potential VDD.

With bit line precharge signal BPC at a logic low level, each PJFET (PPC1 to PPCn) in column select and precharge circuit 300 may be turned on. In this way, each read bit line (RBL1 to RBLn) may be driven to the power supply potential VCC. Thus, it may be important to select potential values for power supply potentials (VDD and VCC) to ensure that BJT Q1 is not turned on in this precharge state (i.e. the pn junction formed from the emitter terminal to the base terminal of BJT Q1 is not forward biased). In this case, to ensure that BJT Q1 is not turned on VCC−VDD should be less than Vfb, where Vfb is the forward bias voltage of the pn junction diode.

With global bit line precharge signal GPC at a logic low level, PJFET P412 in the level translator circuit 410 of sense amplifier circuit 400 may be turned on. With PJFET P412 turned on, the global bit line GBL may be driven to a power supply potential VDD. Also, with enable signal EN at a logic low level, NJFET N412 may be turned off. It should be noted, that there are essentially two series pn junctions between global bit line GBL and the ground potential VCC (two pn junctions formed by base terminal to emitter terminal of BJT Q2 and gate terminal to source terminal of NJFET N436. Thus, in order to prevent excessive standby current, it may be important to ensure that VCC<2Vfb, where Vfb is the forward bias voltage of the pn junction diodes.

With global bit line GBL at essentially a power supply potential VCC, the level shifted out signal LSOUT may be at essentially Vfb lower, where Vfb is the forward bias voltage (turn on) of the base-emitter pn junction diode of BJT Q2. Because reference voltage Vref is lower than VCC-Vfb, differential amplifier 430 can provide a logic low level at terminal 432 and a logic high level at terminal 434. Sense amplifier 440 may provide a logic high output at data output signal Dout.

In the particular example illustrated in FIG. 5, the left waveforms illustrate a read operation of a data "1" stored memory cell MC32 and the right waveforms illustrate a read operation of a data "0" stored in memory cell MC32.

When a data "1" is stored in memory cell MC32, first storage node SN1 has a logic high value and second storage node SN2 has a logic low value latched in memory cell 200. When a data "1" is stored in memory cell MC32, first storage node SN1 has a logic low value and second storage node SN2 has a logic high value latched in memory cell 200.

At time t1, the read word line RWL, corresponding to the row in which the data in a predetermined memory cell (MC11 to MCmn) is to be read, will transition from a low level to a high level. All the other word lines, will remain low. For example, if memory cell MC32 is to be read, word line RWL3 will go high, while read word lines RWL0-2 and RWL4-m will remain low.

When read word line RWL3 goes high, NJFET N3 turns on and PJFET P3 turns off. With NJFET N3 turned on, a low impedance path is formed between storage node SN1 to the base terminal of BJT Q1. However, because the base terminal of BJT Q1 has already been precharged to a high level during the precharge state, the potential of the base terminal of BJT Q1 may essentially remain unchanged.

Also, at time t1, the bit line precharge signal BPC may transition to a high logic level (VDD in this case). With bit line precharge signal BPC high, PJFETs (PPC1 to PPCn) in column select and precharge circuit 300 may be turned off. With PJFET PPC2 turned off, bit line BL2 may be allowed to transition in accordance with the value stored in memory cell MC32 (a logic "1" in this case). Because the base terminal of BJT Q1 is at a high level, BJT Q1 may remain essentially off and bit line BL2 may remain at a logic high level. Bit line BL2 may dip slightly due to leakage current through BJT Q1 as illustrated at time t2 in FIG. 5.

It should be noted that at time t1, each memory cell (MC31 to MC3n) in the row of memory cells selected by word line WL3 transfer data to a respective bit line (BL1 to BLn), however, to avoid unduly cluttering FIG. 5, only bit line BL2 is illustrated.

Also at time t1, the global bit line precharge signal GPC may transition to a high logic level (VCC in this case). With global bit line precharge signal GPC at a high logic level, PJFET the level translator circuit 410 of sense amplifier circuit 400 may be turned off.

At time t2, column select signal CS2 may transition to a logic low level (VSS in this case). With column select signal CS2 at a low level, PJFET PCS2 may be turned on. In this way, a low impedance path may be formed between bit line BL2 and global bit line GBL to allow the data on bit line BL2 to be transferred to global bit line GBL. In this case, the data is a logic "1", as global bit line remains in a logic high level.

Also at time t2, enable signal EN transitions to a logic high level (VDD in this case). With enable signal EN at a logic high level, NJFET N412 is turned on to enable the level translator circuit 410 in sense amplifier circuit 400. Thus, BJT Q2 may be turned on. It should be noted at this point, that PJFET P412 may be designed to provide enough leakage current to satisfy the base current requirements of BJT Q2. With global bit line GBL at a logic high level, level shifted output signal LSOUT may remain at a logic high level (i.e. higher than reference voltage Vref).

With logic shifted output signal LSOUT being higher than the reference voltage Vref, the data output signal $D_{out}$ may remain at a high logic level. In this way, the data "1" may be read out of memory cell MC32 in a read operation.

At time t3, bit line precharge signal BPC, global bit line precharge signal GPC, word line WL3, and enable signal EN may return to a logic low level and column select signal CS2 may return to a logic high level. In this way, memory device 100 may return to a precharge state.

Now, assuming memory cell M32 stores a data "0" value. Before time t4, the memory device 100 may be in the previously explained precharge state.

At time t4, the read word line RWL, corresponding to the row in which the data in a predetermined memory cell (MC11 to MCmn) is to be read, will transition from a low level to a high level. All the other word lines, will remain low. For example, if memory cell MC32 is to be read, word line RWL3 will go high, while read word lines RWL0-2 and RWL4-m will remain low.

When read word line RWL3 goes high, NJFET N3 turns on and PJFET P3 turns off. With NJFET N3 turned on, a low impedance path is formed between storage node SN1 to the base terminal of BJT Q1. In this way, the low logic level stored at first storage node SN1 may be transferred to the base of BJT Q1. Also, at time t4, the bit line precharge signal BPC may transition to a high logic level (VDD in this case). With bit line precharge signal BPC high, PJFETs (PPC1 to PPCn) in column select and precharge circuit 300 may be turned off. With PJFET PPC2 turned off, bit line BL2 may be allowed to transition in accordance with the value stored in memory cell MC32 (a logic "0" in this case).

With the base of BJT Q1 at a low logic level (about VSS in this case), BJT Q1 may be turned on and bit line BL2 may be pulled to a low logic level (in this case, about Vfb).

It should be noted that at time t4, each memory cell (MC31 to MC3n) in the row of memory cells selected by word line WL3 transfer data to a respective bit line (BL1 to BLn), however, to avoid unduly cluttering FIG. 5, only bit line BL2 is illustrated.

Also at time t4, the global bit line precharge signal GPC may transition to a high logic level (VCC in this case). With global bit line precharge signal GPC at a high logic level, PJFET the level translator circuit 410 of sense amplifier circuit 400 may be turned off.

At time t5, column select signal CS2 may transition to a logic low level (VSS in this case). With column select signal CS2 at a low level, PJFET PCS2 may be turned on. In this way, a low impedance path may be formed between bit line BL2 and global bit line GBL to allow the data on bit line BL2 to be transferred to global bit line GBL. In this case, the data is a logic "0", as global bit line is pulled down to essentially the same level as bit line BL2 (about Vfb above ground potential VSS).

Also at time t5, enable signal EN transitions to a logic high level (VDD in this case). With enable signal EN at a logic high level, NJFET N412 is turned on to enable the level translator circuit 410 in sense amplifier circuit 400. Thus, BJT Q2 may be turned on. With global bit line GBL at a logic low level, level shifted output signal LSOUT may be pulled to a logic low level (i.e. lower than reference voltage Vref).

With logic shifted output signal LSOUT being lower than the reference voltage Vref, the data output signal Dout may transition to a low logic level. In this way, the data "0" may be read out of memory cell MC32 in a read operation.

At time t6, bit line precharge signal BPC, global bit line precharge signal GPC, word line WL3, and enable signal EN may return to a logic low level and column select signal CS2 may return to a logic high level. In this way, memory device 100 may return to a precharge state.

The embodiment of FIGS. 1 to 5 discloses a complimentary emitter follower sensing scheme for memory cells including JFET transistors. In particular, BJT Q1 and BJT Q2 are complementary emitter followers in that BJT Q1 is a pnp BJT and BJT Q2 is a npn BJT.

Furthermore, the sensing scheme may be considered a dynamic sensing scheme in that the base current of BJT Q2 may be provided by leakage current from an essentially turned off device, for example.

Also, by using BJT's to provide current drive capabilities, more memory cells 100 may be provided in each column of memory cells connected to a bit line (BL1 to BLn) while maintaining relatively fast read times.

It should be noted that the array of memory cells (MC11 to MCmn) operate at the power supply voltage VDD, thus it may not be necessary to route the power supply voltage VCC internally to the array of memory cells (MC11 to MCmn). Power supply voltage VCC may only be required to be routed to the periphery of the array, for example, to precharge devices (PPC1 to PPCn). In this way, device size may be minimized.

It should also be noted that throughout the voltage swing of a bit line (BL1 to BLn), the logic levels may remain at potentials above the power supply voltage VDD (outside the voltage range operation of the memory cell 200). Then level translator circuit 410, shifts the logic level potential back to within the power supply voltage VDD at level shifted output signal LSOUT and sense amplifier circuit 400 shapes the signal to provide data output signal Dout having essentially a rail-to-rail voltage swing (i.e. from power supply VDD to ground potential VSS).

In other words, the embodiment teaches receiving data latched by a plurality of JFETs (JFETs making up memory cell 200) at a base terminal of a first BJT (BJT Q1), the data having a first logic level (data "1") at a first potential (i.e. power supply potential VDD) and a second logic level (data "0") at a second potential (i.e. ground potential VSS) and providing a data signal at an emitter terminal of the BJT (data on bit line BL) having the first logic level (data "1") at a third potential (see bit line BL potential between times t2 and t3 of FIG. 5) and the second logic level (data "0") at a fourth potential (see bit line BL potential between times t5 and t6 of FIG. 5), the third and fourth potentials being outside the first and second potentials. Then the level translator circuit 410 shows level translating the data signal so that the first logic level and the second logic levels are within the first potential and the second potential (see level shifted output signal LSOUT in FIG. 5).

As noted, the sensing scheme uses complementary BJT arranged in an emitter follower configuration. In the embodiment of FIGS. 1 to 5, the memory cell 200 includes a pnp BJT Q1 and the sense amplifier 400 includes a npn BJT Q2. These "type" BJTs may be reversed as will be illustrated in yet another embodiment.

Figure 6:
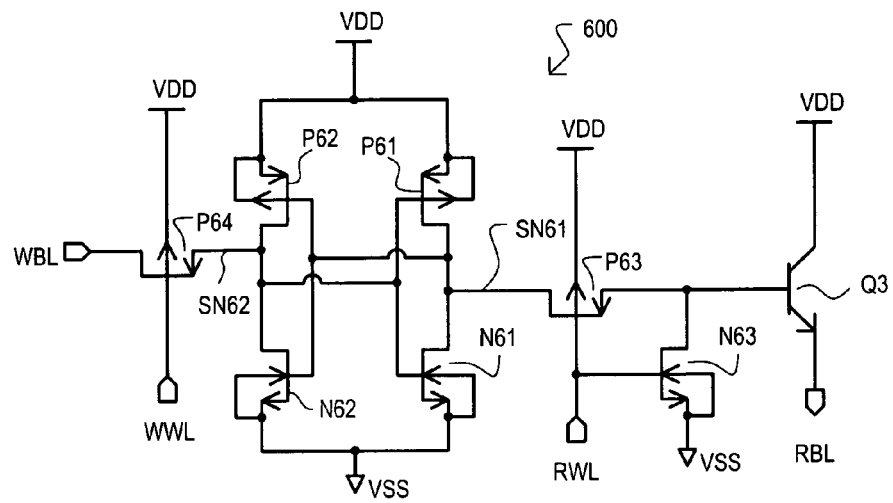
FIG. 6 is a circuit schematic diagram of a memory cell according to an embodiment.

Referring now to FIG. 6, a circuit schematic diagram of a memory cell according to an embodiment is set forth and given the general reference character 600. Memory cell 600 may be used for memory cells (MC11 to MCmn) in the memory device 100 of FIG. 1.

Memory cell 600 can have an input connected to a write bit line WBL, an input connected to a write word line WWL, an input connected to a read word line RWL, and an output connected to a read bit line RBL.

Memory cell 600 may include NJFETs (N61 to N63), PJFETs (P61 to P64), and a BJT Q3. BJT Q3 may be a npn BJT. NJFET N61 may have a source terminal connected to a ground potential VSS, a drain connected to a first storage node SN1, a gate terminal connected to a second storage node SN2, and a body terminal connected to the ground potential VSS. The body terminal may also be conceptualized as a back gate terminal. NJFET N62 may have a source terminal connected to a ground potential VSS, a drain connected to the second storage node SN2, a gate terminal connected to the first storage node SN1, and a body terminal connected to the ground potential VSS. PJFET P61 may have a source terminal connected to a power supply potential VCC, a drain terminal connected to the first storage node SN1, a gate terminal connected to the second storage node SN2, and a body terminal connected to the power supply potential VCC. PJFET P62 may have a source terminal connected to a power supply potential VCC, a drain terminal connected to the second storage node SN2, a gate terminal connected to the first storage node SN1, and a body terminal connected to the power supply potential VCC. PJFET P63 may include a source terminal connected to the first data storage node SN1, a drain terminal commonly connected to a base terminal of BJT Q3 and a drain of PJFET P3, a gate terminal connected to read word line RWL, and a body terminal connected to power supply potential VCC. PJFET P64 may include a source terminal connected to the second data storage node SN2, a drain terminal connected to a write bit line WBL, a gate terminal connected to write word line WWL, and a body terminal connected to power supply potential VCC. NJFET N63 may have a source terminal connected to ground potential VSS, a gate terminal connected to the read word line RWL, and a body terminal connected to power supply potential VEE. BJT Q3 may include an emitter terminal connected to the read bit line RBL and a collector terminal connected to the power supply potential VCC.

PJFETs (P61 and P62) and NJFETs (N61 and N62) collectively form a latch for storing data or the like. NJFET N61 and PJFET P61 form one inverter and NJFET N62 and PJFET P62 form a second inverter. The first and second inverters are cross-coupled in that the input of the first inverter (second storage node SN2) receives the output of the second inverter (first storage node SN1) and vice-versa, thereby forming a latch.

PJFET N63 may be conceptually viewed as a pass gate for passing data from first storage node SN1 to the base of BJT Q3. In this case, PJFET N63 may be a read pass gate. Likewise PJFET N64 may be conceptually viewed as a pass gate for passing data from write bit line WBL to second storage node SN2. In this case, PJFET N64 may be a write pass gate.

Figure 7:
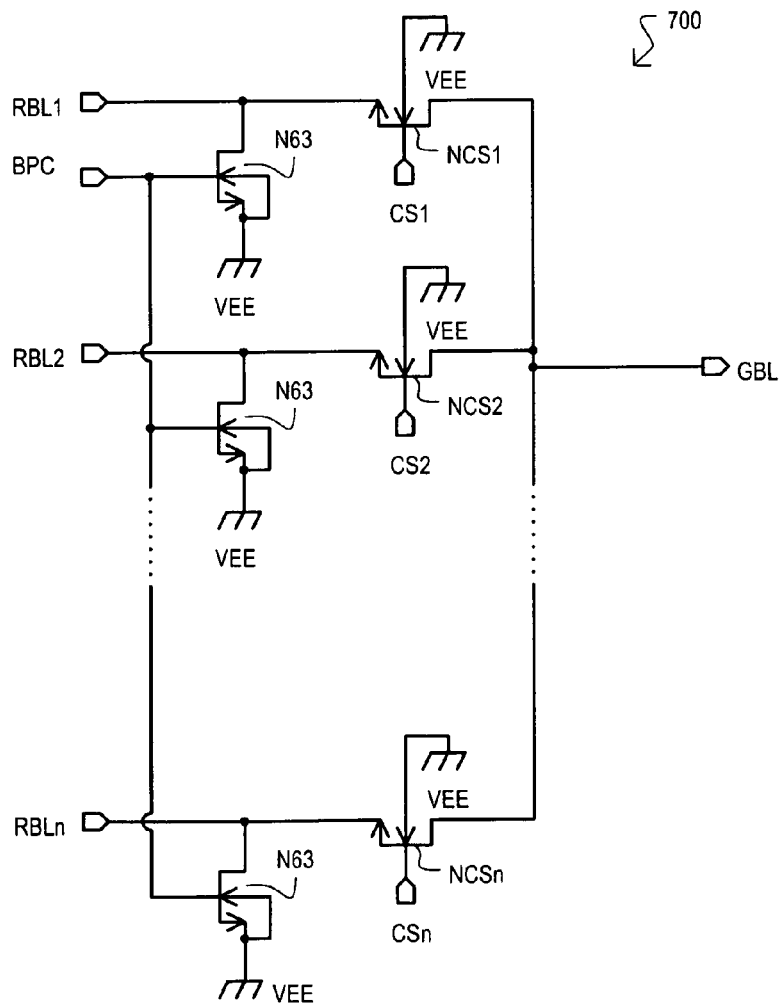
FIG. 7 is a circuit schematic diagram of a column select and bit line precharge circuit according to an embodiment.

Referring now to FIG. 7, a circuit schematic diagram of a column select and bit line precharge circuit according to an embodiment is set forth and given the general reference character 700. Column select and bit line precharge circuit 700 may be used as column select and bit line precharge circuit 120 in the memory device 100 of FIG. 1. It should be noted that the column select and bit line precharge circuit 700 may include write-path circuits which have not been shown to avoid unduly cluttering up the figure.

Column select and bit line precharge circuit 700 may receive read bit lines (RBL1 to RBLn), column select signals (CS1 to CSn), a bit line precharge signal BPC, and may provide data at a global bit line GBL. Column select and bit line precharge circuit 700 may include NJFETs (NCS1 to NCSn) and NJFETs (NPC1 to NPCn).

NJFET NCS1 can have a source terminal connected to read bit line RBL1, a drain terminal connected to global bit line GBL, a gate terminal connected to receive a column select signal CS1, and a body terminal connected to power supply potential VEE. NJFET NCS2 can have a source terminal connected to read bit line RBL2, a drain terminal connected to global bit line GBL, a gate terminal connected to receive a column select signal CS2, and a body terminal connected to power supply potential VEE. Each read bit line (RBL1. RBLn) may include a likewise connected NJFET until NJFET NCSn can have a source terminal connected to read bit line RBLn, a drain terminal connected to global bit line GBL, a gate terminal connected to receive a column select signal CSn, and a body terminal connected to power supply potential VEE.

In this way, NJFETs NCS1 to NCSn may be configured to provide a column selection function so that a predetermined read bit line (RBL1 to RBLn) may be electrically connected to the global bit line GBL in accordance with the activation of a corresponding column select signal (CS1 to CSn).

NJFET NPC1 can have a source connected to power supply potential VEE, a drain connected to read bit line RBL1, a gate connected to receive a bit line precharge signal BPC, and a body terminal connected to power supply potential VEE. NJFET NPC2 can have a source connected to power supply potential VEE, a drain connected to read bit line RBL2, a gate connected to receive a bit line precharge signal BPC, and a body terminal connected to power supply potential VEE. Each read bit line (RBL1 to RBLn) may include a likewise connected NJFET until NJFET NPCn can have a source connected to power supply potential VEE, a drain connected to read bit line RBLn, a gate connected to receive a bit line precharge signal BPC, and a body terminal connected to power supply potential VEE.

In this way, during a precharge operation, bit line precharge signal BPC may go to a logic high level, thus turning on NJFETs (NPC1 to NPCn) to precharge every read bit line (RBL1 to RBLn) to a power supply potential VEE or a low level.

Figure 8:
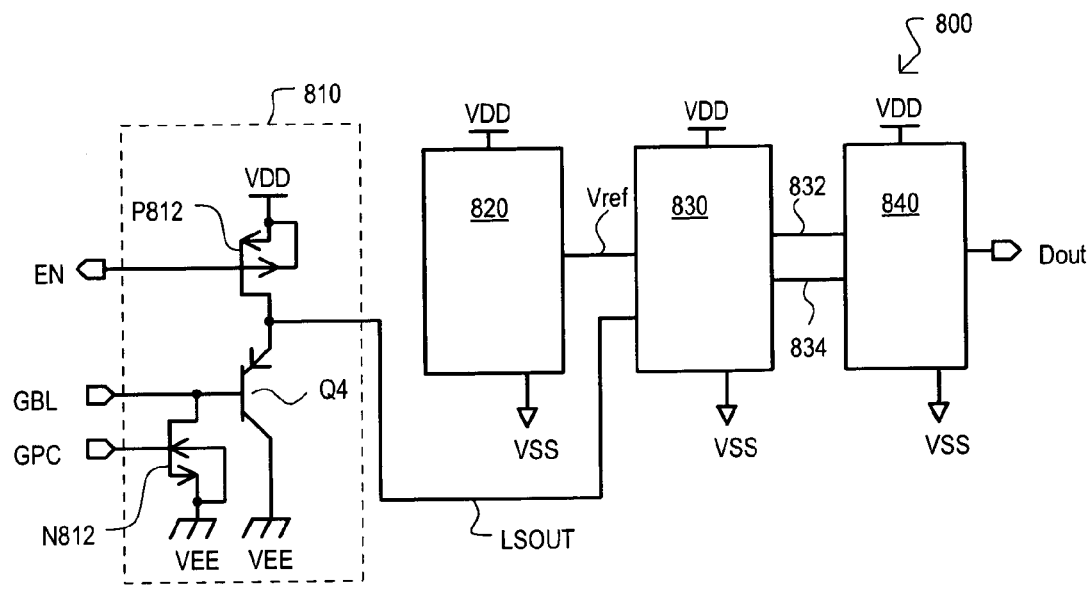
FIG. 8 is a circuit schematic diagram of a sense amplifier circuit according to an embodiment.

Referring now to FIG. 8, a circuit schematic diagram of a sense amplifier circuit according to an embodiment is set forth and given the general reference character 800. Sense amplifier circuit 800 may be used as sense amplifier circuit 130 in the memory device 100 of FIG. 1.

Sense amplifier circuit 800 may have inputs coupled to receive a global precharge signal GPC, a global bit line GBL, and an enable signal EN and may provide a data output signal Dout. Sense amplifier circuit 800 may include a level translator circuit 810, a reference generator circuit 820, a first differential amplifier circuit 830, and a second differential amplifier circuit 840.

The level translator circuit 810 may receive the global precharge signal GPC, enable signal EN, and data on a global bit line GBL as inputs and may provide a level shifted output signal LSOUT as an output. Level translator circuit 810 may include a PJFET P812, NJFET N812, and a BJT Q4. BJT Q4 may be a pnp BJT.

NJFET P812 may have a source terminal connected to the power supply potential VEE, a drain terminal connected to the global bit line GBL, a gate terminal connected to receive global precharge signal GPC, and a body terminal connected to power supply potential VEE. BJT Q4 may have a collector terminal connected to power supply potential VEE, an emitter terminal connected to a drain terminal of PJFET P812 to provide the level shifted output signal LSOUT, and a base terminal connected to receive the data from the global bit line GBL. PJFET N412 may have a source terminal connected to power supply potential VDD, a gate terminal connected to receive enable signal EN, and a body terminal connected to power supply potential VDD.

Reference generator circuit 820 generates a reference voltage Vref used by the first differential amplifier circuit 830. Reference generator 820 may receive power supply potential VDD and ground potential VSS.

First differential amplifier circuit 830 may receive the reference potential Vref and level shifted output signal LSOUT as inputs and may provide differential output signals at terminals (832 and 834). First differential amplifier circuit 830 may receive power supply potential VDD and ground potential VSS.

Second differential amplifier circuit 840 may receive the differential output signals at terminals (832 and 834) provided by first differential amplifier circuit and may provide a data output signal Dout. Second differential amplifier circuit 840 may receive power supply potential VDD and ground potential VSS.

In the particular embodiment of FIGS. 6-8, power supply potential VDD may be about 0.5 volts, power supply potential VEE may be about −0.5 volts, and ground potential may be about 0.0 volts.

The operation of the embodiment of FIGS. 6-8 may be similar to the operation of the embodiment of FIGS. 1-5. However, read and write word lines (RWL1-$m$ and WWL1-$m$) may be active low signals, global bit line precharge signal GPC, bit line precharge signal BPC, may be active low signals, and enable signal EN may be an active high signal. Likewise, the potential of logic high and logic low signals may differ.

Figure 9:
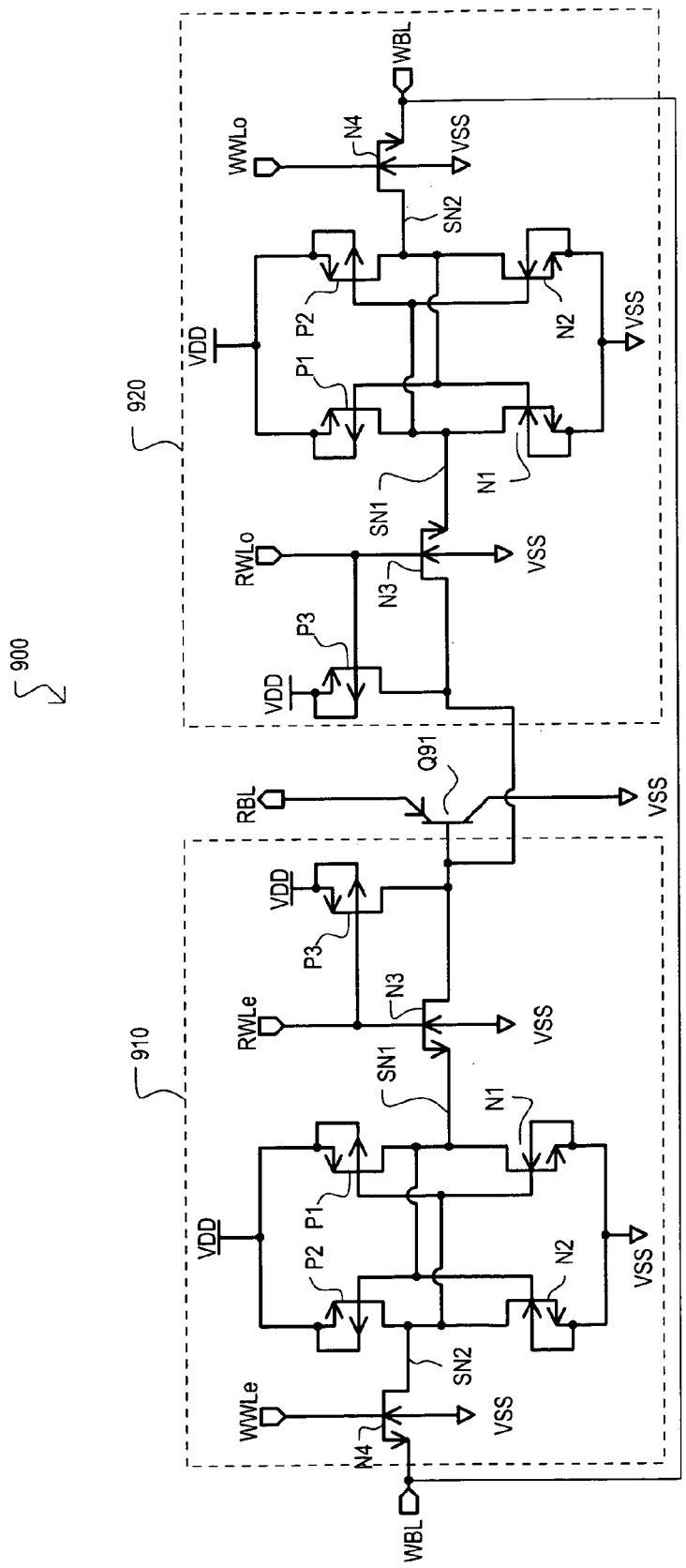
FIG. 9 is a circuit schematic diagram of a pair of memory cells according to an embodiment.

Referring now to FIG. 9, a circuit schematic diagram of a pair of memory cells according to an embodiment is set forth and given the general reference character 900.

The pair of memory cells 900 may include a first memory cell 910, a second memory cell 920, and a shared BJT Q91. First memory cell 910 and memory storage cell 920 may each be essentially identical to memory storage cell 200 with the exclusion of BJT Q1. Instead of each memory cell having a BJT Q1, two adjacent memory cells 910 and 920 may share a BJT Q91.

First memory cell 910 may receive even write word line WWLe and even read word line RWLe. Second memory cell 920 may receive odd write word line WWLo and odd read word line RWLo. In other words, referring to the memory device 100 of FIG. 1, pair of memory cells 900 may form adjacent memory cells MC11 and MC21 such that adjacent memory cells MC11 and MC21 share a common BJT Q91.

Each of the adjacent memory cells 910 and 920 can include a pass gate (JFET N3) having a drain connected to a base terminal of common BJT Q81. Otherwise, the embodiment of FIG. 9 may operate essentially identical to the embodiment of FIGS. 1 to 5.

Figure 10:
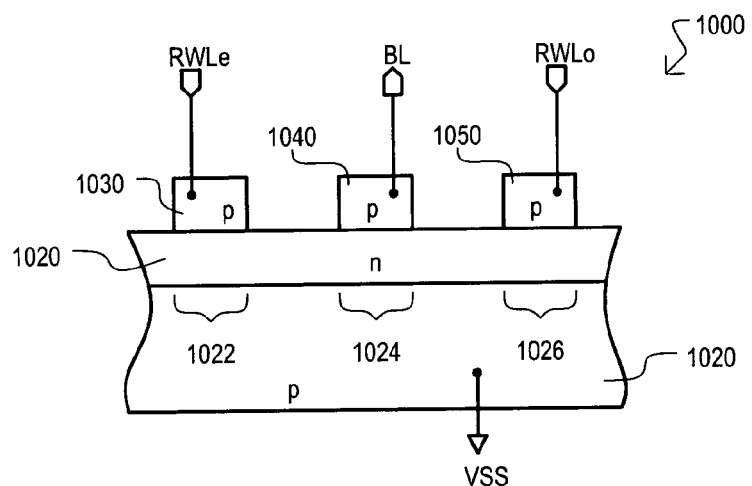
FIG. 10 is a cross sectional diagram of a portion of a memory device illustrating the commonly connected drain terminals of the pass gates and base terminal of common BJT for the pair of memory cells of FIG. 9.

Referring now to FIG. 10, a cross sectional diagram of a portion of a memory device illustrating the commonly connected drain terminals of the pass gates and base terminal of common BJT for the pair of memory cells 900 of FIG. 9.

The portion of a memory device 1000 includes a p-type region 1020, an n-type region 1020 formed on the p-type region 1020, and a plurality of p-type regions (1030 to 1050). P-type regions (1030 to 1050) may be doped polysilicon formed on a semiconductor substrate including p-type region 1020 and n-type region 1020.

P-type region 1010 may commonly form the collector of BJT 91 and the body terminals of each pass gate NJFET N3 in adjacent memory cells (910 and 920) in FIG. 9.

Likewise, p-type region 1020 may commonly form a base terminal of BJT 91 and the channel regions of each pass gate NJFET N3 in adjacent memory cells (910 and 920) in FIG. 9. In particular, the pass gate NJFET N3 in memory cell 910 may include channel region 1022, the pass gate NJFET N3 in memory cell 920 may include channel region 1026, and the BJT 91 may include a base region 1024, all formed in n-type region 1020 of portion of memory device 1000.

P-type region 1030 may form a gate terminal of pass gate NJFET N3 in memory cell 910. P-type region 1050 may form a gate terminal of pass gate NJFET N3 in memory cell 920. P-type region 1040 may form a base terminal of common BJT 91. In this way, it can be noted that the layout of pair of memory cells 900 can be relatively compact due to the sharing of n-type diffusion regions between pass gate JFETs N3 and common BJT 91.

It is understood that ground potential VSS may be conceptualized as a power supply potential. Thus, ground potential VSS, power supply potential VCC, power supply potential VDD, and power supply potential VEE may all be considered power supply potentials.

It is understood that reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of reading data from a memory cell including a plurality of junction field effect transistors (JFETs) including the steps of:
   receiving data latched by the plurality of JFETs at a base terminal of a first bipolar junction transistor (BJT), the data having a first logic level at a first potential and a second logic level at a second potential; and
   providing a data signal at an emitter terminal of the BJT having the first logic level at a third potential and the second logic level at a fourth potential, the third and fourth potentials being outside the first and second potentials.

2. The method of claim 1, further including the step of:
   level translating the data signal so that the first logic level and the second logic levels are within the first potential and the second potential.

\* \* \* \* \*